United States Patent [19]

Maeda et al.

[11] Patent Number: 4,833,647

[45] Date of Patent: May 23, 1989

[54] SEMICONDUCTOR MEMORY DEVICE HAVING HIGH CAPACITANCE AND IMPROVED RADIATION IMMUNITY

[75] Inventors: Satoshi Maeda, Kawasaki; Shizuo Sawada, Yokohama, both of Japan

[73] Assignee: Kabushiki Kaisha Toshiba, Kawasaki, Japan

[21] Appl. No.: 903,997

[22] Filed: Sep. 5, 1986

[30] Foreign Application Priority Data

Sep. 10, 1985 [JP] Japan ................ 60-200026

[51] Int. Cl.⁴ .............. G11C 11/34; G11C 11/24; H01L 29/78; H01L 27/02
[52] U.S. Cl. ............... 365/182; 365/149; 357/23.6; 357/41
[58] Field of Search ............ 365/149, 182; 357/23.6, 357/24, 41

[56] References Cited

U.S. PATENT DOCUMENTS

| | | | |
|---|---|---|---|
| 4,163,243 | 7/1979 | Kamins et al. | 365/149 |
| 4,298,962 | 11/1981 | Hamano et al. | 365/182 |
| 4,355,374 | 10/1982 | Sakai et al. | 365/149 |
| 4,482,908 | 11/1984 | Henderson, Sr. | 365/149 |
| 4,538,166 | 8/1985 | Nakano | 365/149 |

OTHER PUBLICATIONS

Rideout, V. L., IBM Technical Disclosure Bulletin, vol. 21, No. 9, Feb. 1979, "Double Polysilicon Dynamic RAM Cell With Increased Charge Stage Capacitance" pp. 3823–3825.
IBM Technical Disclosure Bulletin, vol. 27, No. 7B, Dec. 1984, pp. 4463; 4464.
IBM Technical Disclosure Bulletin, vol. 26, No. 5, Oct. 1983, pp. 2597–2599.
Patents Abstracts of Japan, vol. 5, No. 34 (E-48) [706], Mar. 4, 1981.
Patents Abstracts of Japan, vol. 7, No. 40 (E-159) [1185], Feb. 17, 1983.
Patents Abstracts of Japan, vol. 9, No. 266 (E-352) [1989], Oct. 23, 1985.
The HI-C Ram Cell Concept-Al F. Tasch, Member, IEEE Jr., et al. pp. 33–41.

*Primary Examiner*—Terrell W. Fears
*Assistant Examiner*—Melissa J. Koval
*Attorney, Agent, or Firm*—Cushman, Darby & Cushman

[57] ABSTRACT

The semiconductor memory device of the present invention is formed on an integrated substrate and is immune to alpha radiation. The device includes a semiconductor substrate of a first conductive type and a memory cell formed in the substrate which has a switching MOS transistor having at least a first impurity region of a second conductive type and a capacitor connected to the transistor for storing memory data. A second impurity region of the first conductive type and having a higher concentration than that of the substrate is provided on the substrate surface at a position covering the first impurity region.

8 Claims, 4 Drawing Sheets

SEMICONDUCTOR MEMORY DEVICE HAVING HIGH CAPACITANCE AND IMPROVED RADIATION IMMUNITY

BACKGROUND OF THE INVENTION

1. Field of the Invention

This invention relates to a semiconductor memory device and method for manufacturing it. The invention is particularly related to a dynamic random access memory (to be referred to as a dynamic RAM hereinafter).

2. Description of Invention Background

Recently, a number of methods which decrease the size of semiconductor integrated circuit elements have been tried to increase packaging density. For example, in dynamic RAMs, MOS capacitors which store data are formed by a parallel combination of two capacitors. One capacitor is formed between an electrode and an inversion region (with anooxidation area therebetween), and another capacitor is formed between the inversion region and a semiconductor substrate. However, since the capacitance is small in this configuration, the area of the memory cell must be large to obtain a large capacitance.

As shown in FIGS. 1 and 2, a memory cell structure of reduced size which removes these faults is illustrated in "The Hi-C RAM Cell Concept" IEEE, ED-25, No. 1, JANUARY 1978, P88 by ALF, TASCH. FIG. 1 is a sectional structure drawing. FIG. 2 is an equivalent circuit of FIG. 1. As shown in FIG. 1, a P type semiconductor substrate 11 consists of, for example, silicon. The doping concentration of substrate 11 is $2 \times 10^{15}$ cm$^{-3}$. A N+ type source region 12 and a N+ type drain region 13 are formed in semiconductor substrate 11. A gate electrode 16 is formed on an insulation layer 15 which is formed on a channel region 14 between source and drain regions and 13. The result is an insulation gate type field effect transistor Q. Source and drain regions and 13 are respectively formed by doping with having arsenic a concentration of $10^{20}$ cm$^{-3}$.

MOS capacitor C is formed adjacent to source 12. MOS capacitor C includes a P− type impurity region 17 adjoining source region 12, N+ type impurity region 18 which has a shallow diffusion depth and is formed in impurity region 17, an insulation layer 19 formed on N+ type impurity region 18 and a polycrystalline silicon gate 20 formed on insulation layer 19. Drain region 13 is connected to a bit line BL, gate electrode 16 is connected to a word line WL and polycrystalline silicon gate 20 is connected to a negative power supply Vs or positive power supply.

In the above configuration, the memory capacitance results from a parallel capacitance of PN junction capacitance Cj between P− type impurity region 17 and N+ type impurity region 18 and an oxide capacitor Ci including insulating layer 19 between polycrystalline silicon gate 20 and N+ type impurity region 18. For this structure, the capacitance value per unit area can be increased and chip area can be reduced.

However, in the above structure, when alpha particles penetrate the surface of semiconductor substrate 11, it can create a significant number of electron-hole pairs near a storage node. Electrons, as minor carriers of the electron-hole pairs, are absorbed in N+ source region 12 to erroneously cause the memory data to change from "1" to "0" (i.e., a soft error). Also, when the memory cell is selected and transistor Q is conductive, the electrons created by the alpha particle radiation are absorbed in N+ impurity region 18 through drain region 13, channel region 14 and source region 12 causing the memory data to erroneously change from "1" to "0".

Furthermore, the concentration of source region 12 is higher than that of N+ impurity region 88. As a result, impurities are diffused in the lateral direction when source region 12 is formed. Therefore, N+ type impurity region 12' diffuses into P− type impurity region 17 as illustrated in FIG. 3. As a result, the contact area between P− type impurity region 17 and N+ type impurity region 18 is decreased, decreasing the memory capacitance.

SUMMARY OF THE INVENTION

An object of this invention is to provide a semiconductor memory device and method of manufacturing the same with which an MOS capacitor is simply formed and has a simple structure, while preventing soft errors.

This is achieved in the present invention with a semiconductor substrate of a first conductive type on which a memory cell is formed. The memory cell has a switching MOS transistor with at least first impurity region of a second conductive type and a capacitance connected to the transistor for storing memory data. A second impurity region of the first conductive type and having a higher concentration than that of the substrate is provided on the substrate surface at a position completely separating the first impurity region from the substrate. In this manner, the invention makes it possible to prevent electrons created in the semiconductor substrate by alpha particle radiation from entering the first impurity region.

BRIEF DESCRIPTION OF THE DRAWINGS

Other objects and advantages of the invention will become apparent from the following detailed description when taken in conjunction with the accompanying drawings, in which.

DETAILED DESCRIPTION OF THE PREFERRED EMBODIMENT

The present invention will now be described in detail according to a preferred embodiment, an example of which is illustrated in the accompanying drawings.

The embodiment of a semiconductor device according to the present invention is shown in FIGS. 4(a) through 4(f). FIGS. 4(a) through 4(f) are cross-sectional views showing the manufacturing steps.

Figure 4A:
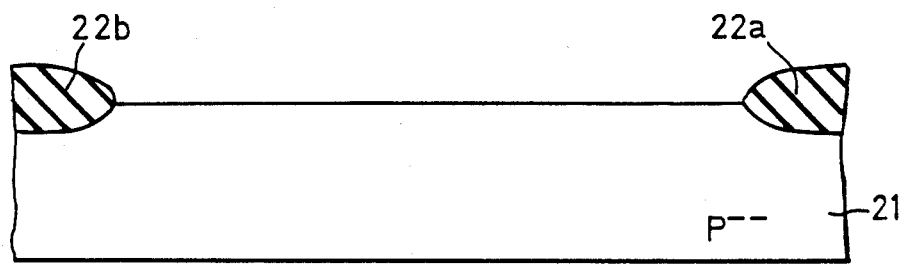
FIGS. 4(a) through 4(f) are cross-sectional views showing the manufacturing steps to provide an embodiment of the semiconductor memory device in accordance with this invention.

First, as shown in FIG. 4(a), field insulation layers 22a, 22b consisting of an oxidation layer are formed by a selective oxidation method on a surface of a semiconductor substrate 21, for example a P− type silicon substrate. Semiconductor substrate 21 is made of silicon with a doping concentration of about $2 \times 10^{15}$ cm$^{-3}$.

Figure 4B:
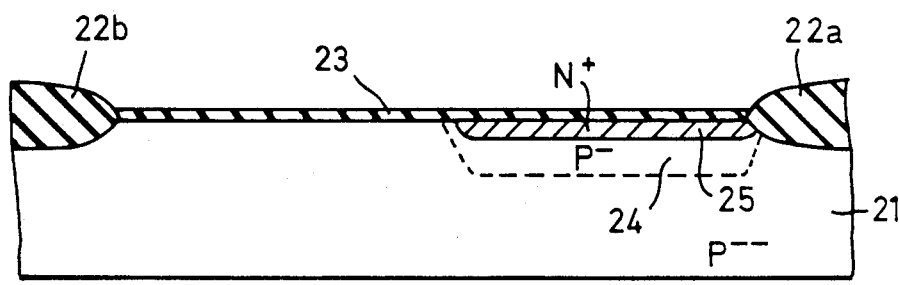

Next, as shown in FIG. 4(b), an insulation layer (oxidation layer) 23 is formed on a surface of a cell region of semiconductor substrate 21 separated by field insulation layers 22a and 22b. Then P$^-$ type impurity region 24 and N$^+$ impurity region 25 constituting a MOS capacitance C are formed by selectively ion implanting P type and N type impurity materials, for example boron and phosphorus, respectively, through insulation layer 23. With ion implantation, either P type impurity material or N type impurity material may be implanted into semiconductor substrate 21 before the other impurity material is implanted. The concentration of P$^-$ type impurity region 24 is about $10^{17}$ cm$^{-3}$ and the concentration of N$^+$ type impurity region 25 is about $10^{19}$ cm$^{-3}$.

Figure 4C:
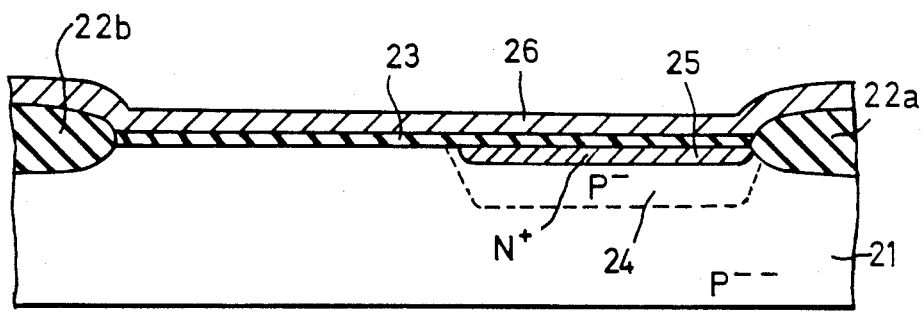
Figure 4D:
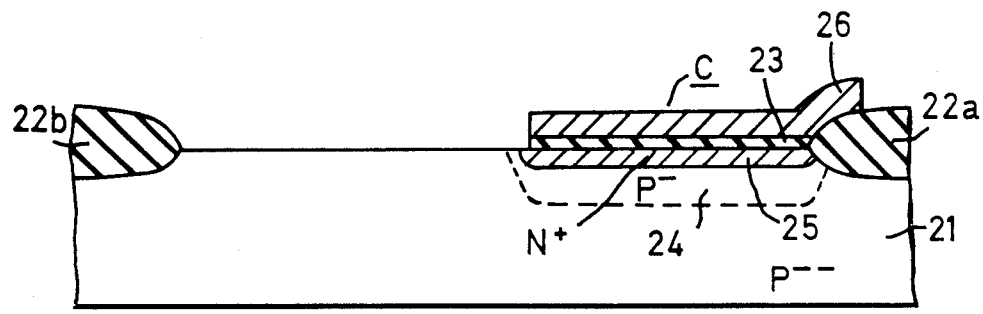

As shown in FIG. 4(c), a polycrystalline silicon layer 26 is deposited on the entire surface of semiconductor substrate 21. As shown in FIG. 4(d), polycrystalline silicon layer 26 and insulation layer 23 are selectively removed by a photo etching method according to a pattern so as to form an MOS capacitor C.

Figure 4E:
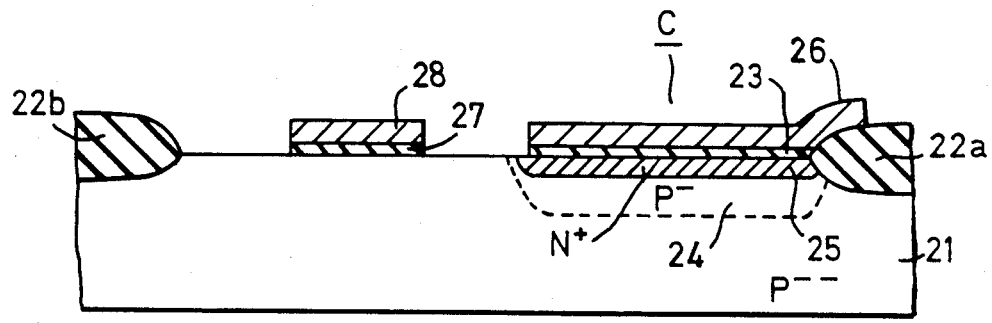

Next, as shown in FIG. 4(e), an insulation layer and a polycrystalline silicon layer are deposited on the surface of semiconductor substrate 21 and are selectively removed by a photo etching process. This forms a gate insulation layer 27 and a gate electrode 28 for a field insulation gate type transistor.

Figure 4F:
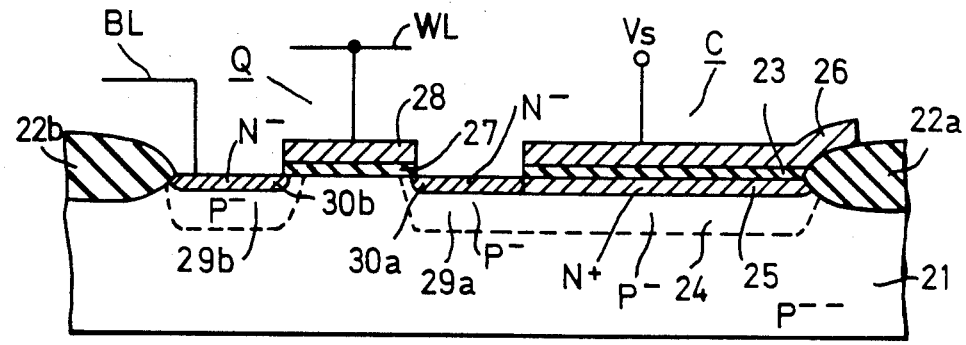

Next, as shown in FIG. 4(f), P$^-$ type impurity regions 29a, 29b and N$^-$ type third and fourth impurity regions 30a and 30b positioned within P$^-$ type impurity regions 29a, 29b are respectively formed by ion implanting P type impurity and N type impurity using gate electrode 28 as a mask. This completes the formation of field insulation gate type transistor Q. The impurity concentration of P$^-$ type impurity regions 29a and 29b and N$^-$ type impurity regions 30a and 30b of this transistor are about $10^{17}$ cm$^{-3}$ and $10^{18}$ cm$^{-3}$, respectively. And in case of ion implantation, either P type impurity or N type impurity may be implanted into the semiconductor substrate before the other impurity is implanted.

Drain region 30b, gate electrode 28 and electrode 26 of MOS capacitance C are respectively connected to bit line BL, word line WL and negative or positive power source Vs. Then the semiconductor memory device is completed.

Figure 5:
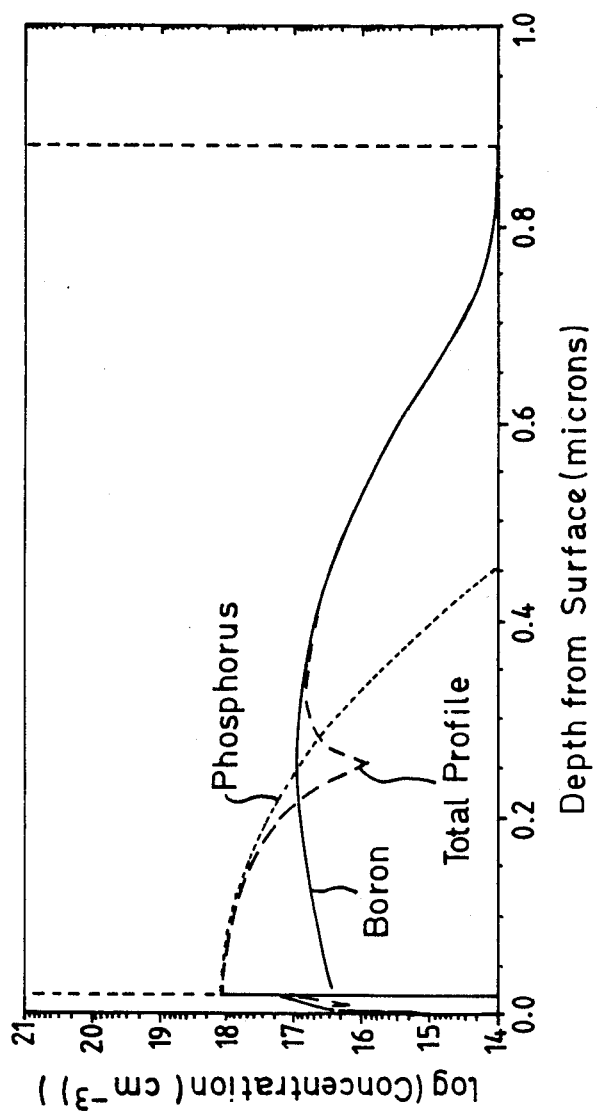
FIG. 5 shows the impurity concentration profile of the semiconductor surface shown in FIG. 4(f).

FIG. 5 shows the impurity concentration profile of P$^-$ type impurity region 29a and N$^-$ impurity region 30a shown in FIG. 4(f). The lateral axis shows the depth from the substrate surface and the longitudinal axis shows the impurity concentration. Boron is used as the P type impurity material and phosphorus is used as the N type impurity material. Phosphorus, as the N type impurity material is better than arsenic with respect to the transistor characteristics.

As would be obvious to those skilled in the art studying FIG. 5, the peak impurity concentration of region 29a is located deeper from the surface of the device, in a direction toward substrate region 21, than that of 30a.

According to this structure, P$^-$ type impurity regions 24, 29a and 29b, having a higher impurity concentration than that of semiconductor substrate 11, are formed under and at the lateral sides of N$^+$ type impurity region 25 and N$^-$ type impurity regions 30a and 30b, which have an opposite conductive type from semiconductor substrate 21. These regions 24, 29a and 29b are used as barriers for electrons and prevent the electrons of the electron-hole pairs, created by alpha particle radiation into semiconductor substrate 21, from reaching the cell region. As a result, soft errors produced by alpha particles are prevented and a semiconductor memory device having a high reliability is obtained.

Figure 1:
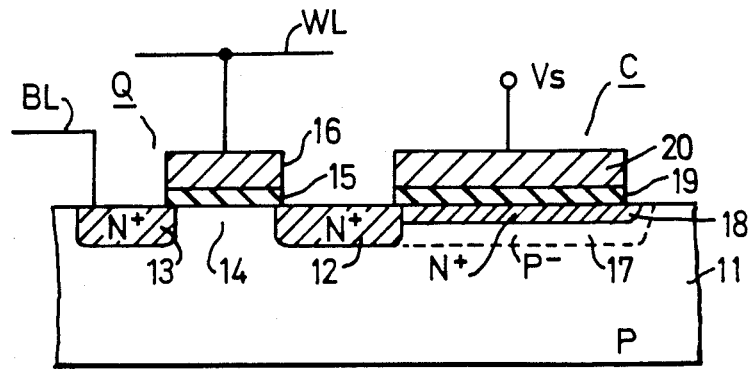
FIG. 1 is a cross-sectional view illustrating a conventional semiconductor memory device.
Figure 2:
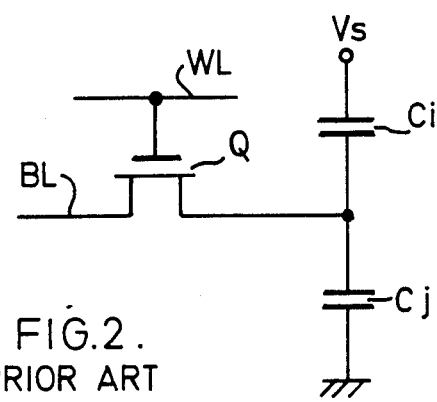
FIG. 2 is an equivalent circuit of the conventional device shown in FIG. 1.
Figure 3:
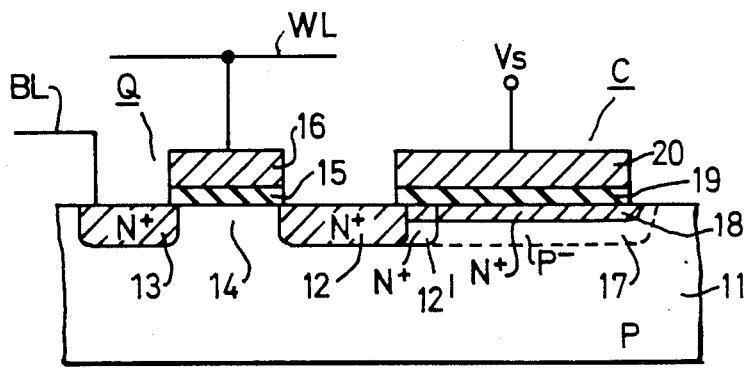
FIG. 3 is a cross-sectional view illustrating another conventional semiconductor memory device.

Furthermore, the impurity concentration o third impurity region 30a shown in FIG. 4(f) is lower than that of the source region shown in FIG. 1 and FIG. 3 and lower than that of N$^+$ impurity region 25 shown in FIG. 4(f). No impurities of third impurity region 30a diffuse into N$^+$ impurity region 25 of MOS capacitor C during the formation of third impurity region 30a. Therefore, the capacitance of MOS capacitor C does not decrease.

Also, since impurity regions 30a and 30b of transistor Q are formed in a self-alignment manner using gate electrode 28 as a mask, the manufacturing process is simple.

As described in detail above, this invention makes it possible to obtain a semiconductor memory device and a method for manufacturing thereof with which a MOS capacitor is simply formed and has a simple structure, while preventing soft errors.

Although only a single preferred embodiment has been described in detail above, those skilled in the art will appreciate that many modifications are possible without departing from the novel teachings and advantages of this invention. Accordingly, all such modifications are intended to be included in this invention as defined, by the following claims.

What is claimed is:

1. A semiconductor memory device comprising:
   a semiconductor substrate region of a first conductivity type;
   a memory cell including a switching MOS transistor having a first and a second impurity region of a second conductivity type and a capacitor connected to said transistor for storing memory data; and
   a third and a fourth impurity region of said first conductivity type, said third impurity region being formed between and entirely separating said substrate region from both said first impurity region and said capacitor and having a higher impurity concentration than that of said substrate region, said fourth impurity region being formed between and entirely separating said substrate region from said second impurity region and having a higher impurity concentration than that of said substrate region, said third and fourth regions enhancing radiation immunity of said memory device.

2. A semiconductor memory device of claim 1 wherein said capacitor includes a capacitance impurity region of said second conductivity type, said capacitance impurity region being disposed contiguous with and electrically contacting said third impurity region, said third impurity region being formed between and entirely separating said substrate region from said first impurity region and said capacitance impurity region.

3. A semiconductor memory device of claim 2 wherein an impurity concentration of said capacitance impurity region is higher than that of said first impurity region.

4. A semiconductor memory device of claim 1 wherein a peak impurity concentration of said third and fourth impurity regions is located deeper from a surface of said device in a direction toward said substrate region than that of said first and second impurity regions.

5. A semiconductor memory device comprising:
a semiconductor substrate region of a first conductivity type;
a first capacitance impurity region of said type and having a higher impurity concentration than that of said substrate region;
a second capacitance impurity region of a second conductivity type, said first capacitance impurity region being between and entirely separating said second capacitance impurity region from said substrate region;
a capacitance insulating film formed on said second capacitance impurity region;
a capacitance electrode formed on said capacitance insulating film;
a gate insulating film formed on a surface of said semiconductor substrate;
a gate electrode formed on said gate insulating film, said gate electrode having a first and a second side;
a first and a second impurity region, of said second conductivity type formed on said first and said second sides of said gate electrode, respectively, said first impurity region being adjacent to and contacting said second capacitance impurity region; and
a third and fourth impurity region of said first conductivity type, said third impurity region being formed between and entirely separating said first impurity region from said substrate region and having a higher impurity concentration than that of said semiconductor substrate region, and said fourth impurity region being formed between and entirely separating said second impurity region from said substrate region and having a higher impurity concentration than that of said semiconductor substrate region, said third and fourth impurity regions enhancing radiation immunity of said memory device.

6. A semiconductor memory device of claim 5 wherein said impurity region first impurity region and said second impurity region form a switching MOS transistor with said gate insulating film and said gate electrode.

7. A semiconductor memory device of claim 6 wherein said first impurity region and said second capacitance impurity region are adjacent and an impurity concentration of said second capacitance impurity region is higher than that of said first impurity region.

8. A semiconductor memory device of claim 5 wherein a peak impurity concentration of said third impurity region is located deeper from a surface of said device in a direction toward said substrate region than that of said first impurity region.

* * * * *